United States Patent [19]

Lenz et al.

[11] Patent Number: 5,186,328
[45] Date of Patent: Feb. 16, 1993

[54] PACKAGING SYSTEM FOR ELECTRICAL CONNECTORS

[75] Inventors: William R. Lenz, Crestwood; Daniel M. Palmieri, Bloomingdale, both of Ill.

[73] Assignee: Molex Incorporated, Lisle, Ill.

[21] Appl. No.: 764,260

[22] Filed: Sep. 23, 1991

[51] Int. Cl.[5] .............................................. B65D 73/02
[52] U.S. Cl. .................................... 206/330; 206/331; 206/495
[58] Field of Search ............... 206/328, 329, 330, 331, 206/332, 338, 341, 345, 346, 478, 479, 480, 495, 820

[56] References Cited

U.S. PATENT DOCUMENTS

| | | | |
|---|---|---|---|
| 4,406,367 | 9/1983 | Bouwknegt | 206/329 |
| 4,568,416 | 2/1986 | Okui et al. | 206/331 X |
| 4,583,641 | 4/1986 | Gelzes | 206/329 X |
| 4,631,897 | 12/1986 | Slavicek | 206/330 X |
| 4,736,841 | 4/1988 | Kaneko et al. | 206/328 X |
| 4,852,737 | 8/1989 | Noll | 206/328 X |
| 4,867,308 | 9/1989 | Crawford et al. | 206/328 X |
| 4,966,281 | 10/1990 | Kawanishi et al. | 206/330 |
| 5,132,160 | 7/1992 | Bird | 206/332 X |

Primary Examiner—Jimmy G. Foster
Assistant Examiner—Jacob K. Ackun, Jr.
Attorney, Agent, or Firm—Stephen Z. Weiss

[57] ABSTRACT

A packaging system is disclosed for a plurality of electrical connectors each having a longitudinal axis between opposite ends thereof. The system includes an elongated carrier strip having a given width on which the electrical connectors are mounted. The connectors are mounted adjacent each other in an end-to-end array with the longitudinal axes of the connectors extending in the longitudinal direction of the carrier strip.

13 Claims, 1 Drawing Sheet

PACKAGING SYSTEM FOR ELECTRICAL CONNECTORS

FIELD OF THE INVENTION

This invention generally relates to the art of electrical connectors and, particularly, to a packaging system for a plurality of electrical connectors on a carrier strip.

BACKGROUND OF THE INVENTION

Electrical connectors are mass produced by positioning an insulative housing, generally a plastic rectangularly shaped member, automatically at various locations along an assembly line for pin insertion and other machine accomplished steps until the electrical connector is in its final manufactured form. Heretofore, once the electrical connector is completed, the connectors are automatically conveyed to a completed connector hopper positioned to receive the connectors from a conveyor so that the completed connectors fall one by one into the hopper where they fall upon each other. This causes damage to the extending pins or conductors such as by causing some of the plated-on highly conductive metal to be scraped away from the conductors or pins or by bending the pins.

The connectors are manually removed from the hopper, one by one, inspected and manually packaged. Packaging the connectors can be done in bulk by filling a plastic bag or other suitable container with a number of connectors in contact with each other in a random manner, but bulk packaging generally is unsuitable because many of the connectors are damaged during transport. Another more time consuming and expensive method of packaging connectors has been by manually aligning the connectors in layers in a suitable container, such as a cardboard box, to minimize connector contact during storage. A layer of compressible material sometimes is disposed between each layer of handpacked connectors to minimize damage to the connectors during transport.

An improved type of packaging system which has experienced increasing significance involves the use of carrier strips on which electrical connectors or electronic components are mounted and carried. The strips are used, for example, for mounting or receiving a large number of electrical connectors, with the strips and retained connectors being wound on a reel or packaged in a container suitable for use in storage, transportation and retrieval of the packaged connectors. For example, the carrier strips are used to transport the electrical connectors or electronic components from a component manufacturer to a customer's assembly station where automatic equipment functions to remove the connectors from the carrier strip and mount the connectors to a printed circuit board or the like. The carrier strip also may function to bring different electrical connectors to an assembly station in proper order for sequential assembly.

Examples of such carrier strips and/or packaging systems are shown in U.S. Pat. Nos. 4,823,945 to Adelman, dated Apr. 25, 1989; 4,929,486 to Itou et al, dated May 29, 1990; 4,966,282 to Kawaniski et al, dated Oct. 20, 1990; 4,994,300 to Itou et al, dated Feb. 19, 1991; 5,005,275 to Borst et al, dated Apr. 9, 1991; 5,025,923 to Okui, dated Jun. 25, 1991; and 4,617,733 to Olson, dated Oct. 21, 1986 and assigned to the assignee of this invention.

One of the problems with carrier strip packaging systems of the character described is that certain electrical connectors or electronic components are manufactured in a wide variety of sizes, particularly different lengths. For instance, a type of electrical connector, commonly termed a header connector, includes a dielectric housing of a given length, with terminal pins projecting transversely of the housing for insertion into appropriate holes in a printed circuit board. The length of the header connector is determined by the number of circuits/terminal pins for which the connector was designed. Often, the terminal pins run the length of the dielectric housing in a plurality of rows. A given connector may have a "circuit size" ranging from two to fifteen or more circuits. Consequently, the lengths of the connectors according will be considerably different. Heretofore, such electrical connectors were mounted on the carrier strip with the lengths or axes of the connectors transverse to the length of the carrier strip. This results in the requirement of an inventory of carrier strips of different widths which, in turn, requires different sizes of reels or different sizes of boxes or containers. Transporting equipment also has to be capable of adjustment for the different sizes of packaging components. The end result is that carrier strip packaging systems are more expensive than one might consider.

This invention is directed to solving the above problems and providing a carrier strip type packaging system wherein the carrier strips, containers or boxes, and the like can be of constant dimensions regardless of the size or length parameters of the carried electrical connectors.

SUMMARY OF THE INVENTION

An object, therefore, of the invention is to provide a new and improved packaging system for a plurality of electrical connectors, particularly a carrier strip type packaging system.

Generally, the packaging system is directed to accommodating a plurality of electrical connectors each having a longitudinal axis or length between opposite ends thereof and terminals projecting therefrom transversely of the axis. The system includes an elongated carrier strip having a given width and on which the electrical connectors are mounted or retained.

The invention contemplates a system wherein the electrical connectors are mounted or retained on the carrier strip adjacent each other in an end-to-end array, with the longitudinal axes of the connectors extending in the longitudinal direction of the carrier strip. Consequently, the width of the carrier strip and/or reels or containers within which the strips and retained connectors are packaged is not dependent upon the "circuit" size or length of the connectors.

In one illustrated embodiment of the invention, the carrier strip includes adhesive means for securing and retaining the electrical connectors thereon. In another embodiment of the invention, the carrier strip includes a base tape on which the electrical connectors are to be mounted and a cover tape for covering the electrical connectors. Co-adhesive means are provided on the base tape and the cover tape providing adhesion between the tapes but not between the tapes and the electrical connectors. This will secure the electrical connectors between the tapes while allowing easy removal of the connectors from between the tapes after the tapes are opened or separated.

The invention also contemplates providing equally spaced fold means in the carrier strip to facilitate folding the carrier strip in a boustrophedon pattern to stack the electrical connectors in a box or container. The electrical connectors are mounted on the carrier strip in spaced clusters separated by the fold means. The number of connectors in each cluster simply is determined by the circuit size.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENTS

Figure 1:
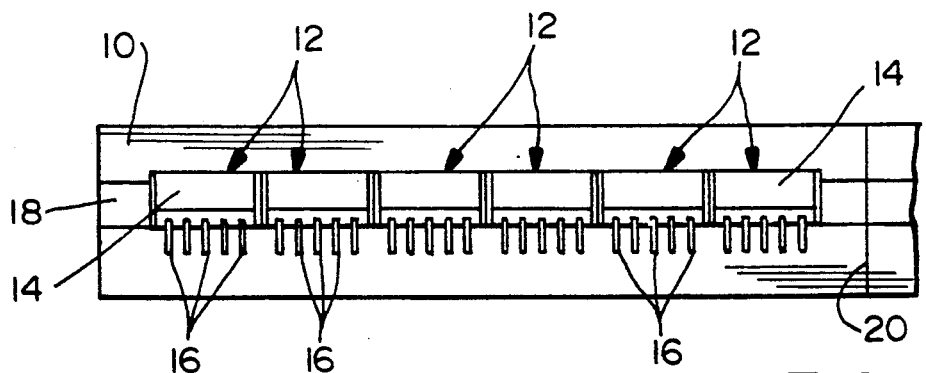
FIG. 1 is a fragmented plan view of a carrier strip having a cluster of electrical connectors mounted thereon according to the invention.

Referring to the drawings in greater detail, the invention generally is directed to a packaging system for a plurality of electrical connectors each having a longitudinal axis or length between opposite ends thereof. For instance, the electrical connectors may be in the form of header connectors for mounting to a printed circuit board.

Referring first to FIG. 1, the packaging system utilizes a carrier strip 10 having a plurality of electrical connectors, generally designated 12, mounted thereon. Each electrical connector is shown generally as a header connector having a dielectric housing 14 with a plurality of terminal pins 16 projecting therefrom transversely of the carrier strip. Each connector/housing therefore is elongated and the length of the housing is determined by the "circuit size" of the connector, i.e. the number of terminals accommodated by the connector. In the illustrated embodiment, six connectors 12 are shown with each connector having five terminal pins 16 projecting in a row therefrom. Of course, as it known with header connectors, there may be more than one row of terminals and projecting terminal pins.

In the embodiment of FIG. 1, connectors 12 are mounted or retained directly on carrier strip 10 by adhesive means 18. As shown, the adhesive means is provided in the form of a narrow strip of adhesive running the length of the carrier strip at a central location transversely thereof, whereat the housings of the connectors can be adhered to the strip of adhesive.

As shown in FIG. 1, the invention contemplates that electrical connectors 12 be mounted or retained on carrier strip 10 adjacent each other in an end-to-end array, with the longitudinal axes or lengths of the connectors extending in the longitudinal direction of the carrier strip. As stated above, variances in the dimensions of header-type connectors of the character described involves variances in the lengths of the connectors to provide different circuit sized connectors. Consequently, with the connectors adhered to carrier strip 10 with their lengths parallel to the length of the carrier strip, the width of the carrier strip can be maintained constant regardless of the circuit size of the header connectors.

As stated above, connectors 12 are mounted and retained directly on carrier strip 10 adjacent each other in an end-to-end array. In FIG. 1, the connectors are shown in end-to-end abutting positions, but it should be understood that the connectors do not have to abut, although the abutting relationship may facilitate assembly of the connectors onto the carrier strip and may increase the number of connectors that can be mounted on the carrier strip for any given unit of length of the strip.

Carrier strip 10 may be provided with fold means at spaced locations along the length of the strip. In FIG. 1, the fold means is indicated by a line 20. This line may be a weakened area of the carrier strip, such as a perforated line, for instance.

Figure 2:
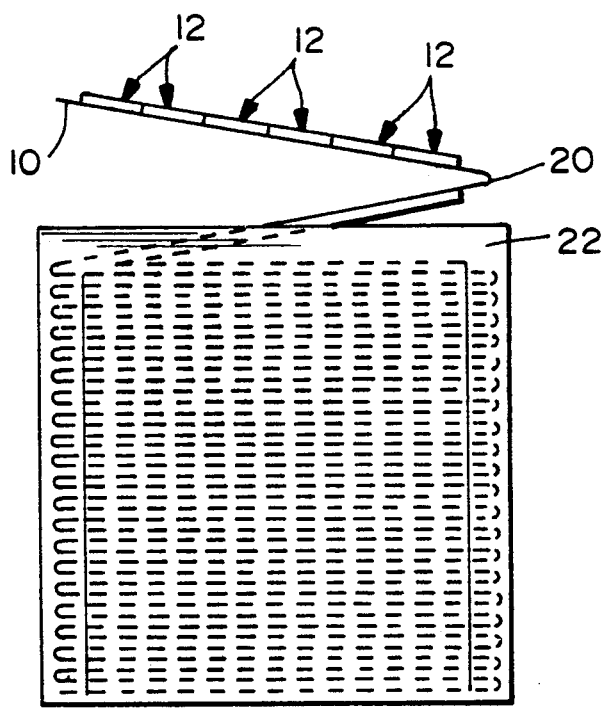
FIG. 2 shows a somewhat schematic illustration of a box or container, illustrating the carrier strip of FIG. 1 being folded thereinto in a boustrophedon pattern.

Referring to FIG. 2 in conjunction with FIG. 1, once electrical connectors 12 are mounted and retained on carrier strip 10, one form of storage scheme is to fold the strip and retained connectors in a boustrophedon pattern, as illustrated, with the carrier strip being folded along equally spaced fold lines 20 in a back-and-forth manner to thereby stack the electrical connectors in a box or container 22. With this scheme of packaging, fold lines 20 would be equally spaced along the length of the carrier strip, and the electrical connectors would be mounted on the carrier strip in clusters between the equally spaced fold lines.

With the carrier strip being of a constant width regardless of the circuit size of the header connectors, due to the lengthwise mounting of the carriers onto the carrier strip, boxes 22 (FIG. 2) can be provided and maintained in inventory for storing the stacked connectors, again with the boxes being of a constant width to reduce the expenses of maintaining different sizes of boxes. Likewise, if the carrier strip were to be wound on a reel for subsequent assembly operations, reels could be provided of a constant width regardless of the circuit sizes of the header connectors mounted or retained on the carrier strip.

Figure 3:
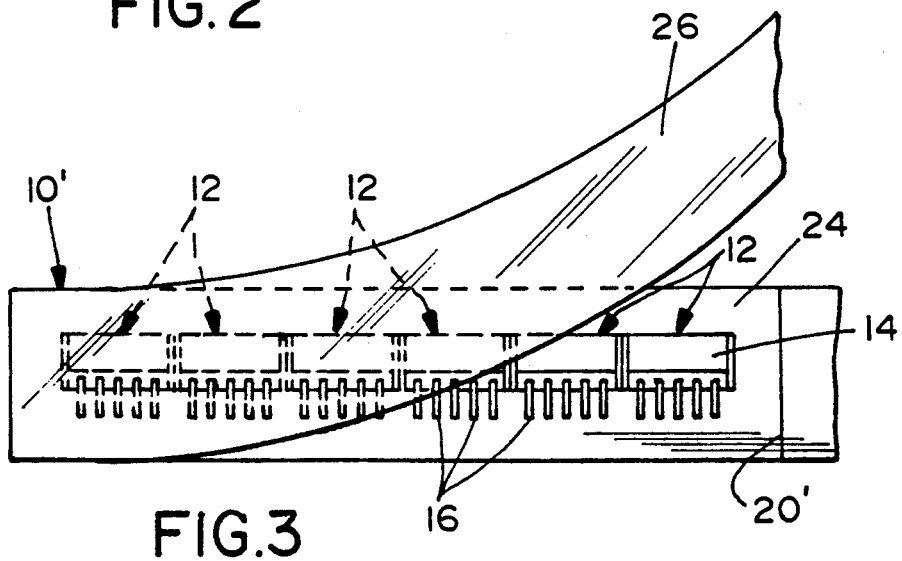
FIG. 3 is a fragmented plan view, similar to that of FIG. 1, of an alternate form of the invention.

FIG. 3 shows an alternate form of carrier strip, generally designated 10', which incorporates the concepts of the invention described above in relation to FIGS. 1 and 2. In the embodiment of FIG. 3, carrier strip 10' includes a base tape 24 onto which a plurality of electrical connectors 12 are to be mounted as described in relation to FIG. 1. A cover tape 26 is provided for covering the electrical connectors. Co-adhesive means is provided on base tape 24 and cover tape 26 whereby the cover tape adheres to the base tape and holds the connectors in their prescribed array. Again, at least base tape 24 of carrier strip 10' includes fold lines 20' whereby the carrier strip can be folded as described in relation to FIG. 2. Regardless of the nature of the carrier strip, comparing FIGS. 1 and 2, the carrier strip can be maintained of a constant width regardless of the circuit sizes of the header connectors because of the lengthwise orientation of the connectors on the carrier strip.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. In a packaging system including a plurality of electrical connectors each having a longitudinal axis between opposite ends thereof and terminals projecting transverse of the axis, and an elongated planar carrier strip having a given width and on which the electrical connectors are mounted, the improvement wherein the electrical connectors are mounted on the carrier strip adjacent each other in an end-to-end abutting array with the longitudinal axes of the connectors extending in the longitudinal direction of the carrier strip.

2. In the packaging system of claim 1, including adhesive means on the carrier strip for securing the electrical connectors directly thereon.

3. In the packaging system of claim 1, wherein the carrier strip includes a base tape upon which the electrical connectors are to be mounted and a cover tape for covering the electrical connectors.

4. In the packaging system of claim 3 including means for joining the base tape to the cover tape with the electrical connectors secured therebetween.

5. In the packaging system of claim 4, wherein said joining means includes co-adhesive means on the base tape and the cover tape providing adhesion between the tapes.

6. In the packaging system of claim 1, including fold means in the carrier strip for folding and stacking sections of the carrier strip and secured electrical connectors.

7. In the packaging system of claim 6, wherein said electrical connectors are mounted on the carrier strip in spaced clusters separated by said fold means.

8. In the packaging system of claim 1, wherein said carrier strip and secured electrical connectors are folded in a boustrophedon pattern to stack the electrical connectors.

9. In the packaging system of claim 8, including equally spaced fold means in the carrier strip to facilitate said folding of the carrier strip.

10. In the packaging system of claim 9, wherein said electrical connectors are to be mounted on the carrier strip in spaced clusters separated by said fold means.

11. In the packaging system of claim 10, including adhesive means on the carrier strip for securing the electrical connectors thereon.

12. In the packaging system of claim 10, wherein the carrier strip includes a base tape upon which the electrical connectors are to be mounted and a cover tape for covering the electrical connectors.

13. In the packaging system of claim 12, including co-adhesive means on the base tape and the cover tape joining the base tape to the cover tape with the electrical connectors secured therebetween.

* * * * *